(12) United States Patent
Kim et al.

(10) Patent No.: US 9,030,248 B2
(45) Date of Patent: May 12, 2015

(54) LEVEL SHIFTER WITH OUTPUT SPIKE REDUCTION

(75) Inventors: Tae Youn Kim, San Diego, CA (US); Robert Mark Englekirk, Pacific Palisades, CA (US); Dylan J. Kelly, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 648 days.

(21) Appl. No.: 12/460,442

(22) Filed: Jul. 17, 2009

(65) Prior Publication Data
US 2010/0033226 A1 Feb. 11, 2010

Related U.S. Application Data

(60) Provisional application No. 61/135,278, filed on Jul. 18, 2008.

(51) Int. Cl.
*H03L 5/00* (2006.01)
*H03K 19/0185* (2006.01)
*H03K 19/003* (2006.01)

(52) U.S. Cl.
CPC ...... *H03K 19/0185* (2013.01); *H03K 19/00369* (2013.01)
USPC .................. 327/333; 326/62; 326/81

(58) Field of Classification Search
USPC .................. 326/62–63, 80–82; 327/306, 333
See application file for complete search history.

(56) References Cited

U.S. PATENT DOCUMENTS

| | | |
|---|---|---|
| 3,646,361 A | 2/1972 | Pfiffner |
| 3,995,228 A | 11/1976 | Pass |
| 4,158,182 A | 6/1979 | Washburn |
| 4,316,101 A | 2/1982 | Minner |
| 4,374,357 A | 2/1983 | Olesin et al. |

(Continued)

FOREIGN PATENT DOCUMENTS

| | | |
|---|---|---|
| DE | 102005039138 | 2/2007 |
| EP | 0622901 | 11/1994 |

(Continued)

OTHER PUBLICATIONS

Englund, Terry Lee, Office Action received from the USPTO dated Apr. 20, 2012 for related U.S. Appl. No. 12/799,583, 20 pgs.

(Continued)

*Primary Examiner* — Dinh Le
(74) *Attorney, Agent, or Firm* — Jaquez Land Richman LLP; Martin J. Jaquez, Esq.

(57) ABSTRACT

A level shifter, or method, producing a final output from a driver supplied by a high-side source driver providing VDD or common, and a low-side source driver providing common or VSS. A delay is introduced to prevent a source driver output at common from beginning to transition toward a supply rail until a delaying source driver at a rail begins transitioning toward common. The level shifter may be single-ended or differential, and the delaying source driver may be coupled to the same final output driver as is the delayed source driver, or may be coupled to a different final output driver. The level shifter may have a second level shifter front end stage, which may have high-side and low-side intermediate source driver outputs coupled by a capacitor, and/or may couple one of the supplies to all intermediate source drivers via a common impedance or current limit Zs.

21 Claims, 4 Drawing Sheets

(56) References Cited

U.S. PATENT DOCUMENTS

| | | |
|---|---|---|
| 4,390,798 A | 6/1983 | Kurafuji |
| RE31,749 E | 11/1984 | Yamashiro |
| 4,638,184 A | 1/1987 | Kimura |
| 4,736,169 A | 4/1988 | Weaver et al. |
| 4,739,191 A | 4/1988 | Puar |
| 4,746,960 A | 5/1988 | Valeri et al. |
| 4,891,609 A | 1/1990 | Eilley |
| 5,023,494 A | 6/1991 | Tsukii et al. |
| 5,061,907 A | 10/1991 | Rasmussen |
| 5,182,529 A | 1/1993 | Chern |
| 5,208,557 A | 5/1993 | Kersh, III |
| 5,274,343 A | 12/1993 | Russell et al. |
| 5,317,181 A | 5/1994 | Tyson |
| 5,446,418 A | 8/1995 | Hara et al. |
| 5,483,195 A | 1/1996 | Brown |
| 5,493,249 A | 2/1996 | Manning |
| 5,528,245 A | 6/1996 | Aker et al. |
| 5,554,892 A | 9/1996 | Norimatsu |
| 5,670,907 A | 9/1997 | Gorecki et al. |
| 5,694,308 A | 12/1997 | Cave |
| 5,729,039 A | 3/1998 | Beyer et al. |
| 5,734,291 A | 3/1998 | Tasdighi et al. |
| 5,793,246 A | 8/1998 | Vest et al. |
| 5,808,505 A | 9/1998 | Tsukada |
| 5,812,939 A | 9/1998 | Kohama |
| 5,818,289 A | 10/1998 | Chevallier et al. |
| 5,818,766 A | 10/1998 | Song |
| 5,864,328 A | 1/1999 | Kajimoto |
| 5,874,849 A | 2/1999 | Marotta et al. |
| 5,878,331 A | 3/1999 | Yamamoto et al. |
| 5,892,400 A | 4/1999 | van Saders et al. |
| 5,917,362 A | 6/1999 | Kohama |
| 5,945,867 A | 8/1999 | Uda et al. |
| 5,959,335 A | 9/1999 | Bryant et al. |
| 6,020,781 A | 2/2000 | Fujioka |
| 6,064,275 A | 5/2000 | Yamauchi |
| 6,064,872 A | 5/2000 | Vice |
| 6,081,165 A | 6/2000 | Goldman |
| 6,087,968 A | 7/2000 | Roza |
| 6,122,185 A | 9/2000 | Utsunomiya et al. |
| 6,169,444 B1 | 1/2001 | Thurber, Jr. |
| 6,188,590 B1 | 2/2001 | Chang et al. |
| 6,195,307 B1 | 2/2001 | Umezawa et al. |
| RE37,124 E | 4/2001 | Monk et al. |
| 6,226,206 B1 | 5/2001 | Maeda |
| 6,249,446 B1 | 6/2001 | Shearon et al. |
| 6,297,687 B1 | 10/2001 | Sugimura |
| 6,308,047 B1 | 10/2001 | Yamamoto et al. |
| 6,337,594 B1 | 1/2002 | Hwang |
| 6,400,211 B1 | 6/2002 | Yokomizo et al. |
| 6,414,863 B1 | 7/2002 | Bayer et al. |
| 6,429,632 B1 | 8/2002 | Forbes et al. |
| 6,429,723 B1 | 8/2002 | Hastings |
| 6,429,730 B2 | 8/2002 | Houghton et al. |
| 6,452,232 B1 | 9/2002 | Adan |
| 6,486,729 B2 | 11/2002 | Imamiya |
| 6,504,213 B1 | 1/2003 | Ebina |
| 6,537,861 B1 | 3/2003 | Kroell et al. |
| 6,559,689 B1 | 5/2003 | Clark |
| 6,563,366 B1 | 5/2003 | Kohama |
| 6,617,933 B2 | 9/2003 | Ito et al. |
| 6,653,697 B2 | 11/2003 | Hidaka et al. |
| 6,677,641 B2 | 1/2004 | Kocon |
| 6,714,065 B2 | 3/2004 | Komiya et al. |
| 6,717,458 B1 | 4/2004 | Potanin |
| 6,774,704 B2 * | 8/2004 | Kushnarenko ............... 327/530 |
| 6,784,737 B2 | 8/2004 | Martin et al. |
| 6,788,130 B2 | 9/2004 | Pauletti et al. |
| 6,801,076 B1 | 10/2004 | Merritt |
| 6,804,502 B2 * | 10/2004 | Burgener et al. ............. 455/333 |
| 6,816,016 B2 | 11/2004 | Sander et al. |
| 6,819,938 B2 | 11/2004 | Sahota |
| 6,871,059 B1 | 3/2005 | Piro et al. |
| 6,879,502 B2 | 4/2005 | Yoshida et al. |
| 6,891,234 B1 | 5/2005 | Connelly et al. |
| 6,947,720 B2 | 9/2005 | Razavi et al. |
| 7,023,260 B2 | 4/2006 | Thorp et al. |
| 7,042,245 B2 | 5/2006 | Hidaka |
| 7,109,532 B1 | 9/2006 | Lee et al. |
| 7,123,898 B2 | 10/2006 | Burgener et al. |
| 7,161,197 B2 | 1/2007 | Nakatsuka et al. |
| 7,212,788 B2 | 5/2007 | Weber et al. |
| 7,355,455 B2 | 4/2008 | Hidaka |
| 7,391,282 B2 | 6/2008 | Nakatsuka et al. |
| 7,460,852 B2 | 12/2008 | Burgener et al. |
| 7,515,882 B2 | 4/2009 | Kelcourse et al. |
| 7,546,089 B2 | 6/2009 | Bellantoni |
| 7,659,152 B2 | 2/2010 | Gonzalez et al. |
| 7,719,343 B2 | 5/2010 | Burgener et al. |
| 7,733,156 B2 | 6/2010 | Brederlow et al. |
| 7,733,157 B2 | 6/2010 | Brederlow et al. |
| 7,741,869 B2 | 6/2010 | Hidaka |
| 7,796,969 B2 | 9/2010 | Kelly et al. |
| 7,860,499 B2 | 12/2010 | Burgener et al. |
| 7,910,993 B2 | 3/2011 | Brindle et al. |
| 7,928,759 B2 | 4/2011 | Hidaka |
| 7,982,265 B2 | 7/2011 | Challa et al. |
| 8,138,815 B2 * | 3/2012 | Taddiken et al. ............. 327/333 |
| 8,378,736 B2 | 2/2013 | Burgener et al. |
| 8,441,299 B2 | 5/2013 | Olson et al. |
| 8,686,787 B2 | 4/2014 | Swonger |
| 8,816,659 B2 | 8/2014 | Kim et al. |
| 2001/0031518 A1 | 10/2001 | Kim et al. |
| 2002/0115244 A1 | 8/2002 | Park et al. |
| 2002/0140412 A1 | 10/2002 | Maneatis |
| 2003/0034849 A1 | 2/2003 | Sanduleanu et al. |
| 2003/0141543 A1 | 7/2003 | Bryant et al. |
| 2003/0201494 A1 | 10/2003 | Maeda et al. |
| 2004/0061130 A1 | 4/2004 | Morizuka |
| 2004/0129975 A1 | 7/2004 | Koh et al. |
| 2004/0204013 A1 | 10/2004 | Ma et al. |
| 2005/0052220 A1 | 3/2005 | Burgener et al. |
| 2005/0077564 A1 | 4/2005 | Forbes |
| 2005/0121699 A1 | 6/2005 | Chen et al. |
| 2006/0194558 A1 | 8/2006 | Kelly |
| 2006/0284670 A1 | 12/2006 | Eid et al. |
| 2007/0045697 A1 | 3/2007 | Cheng et al. |
| 2007/0146064 A1 | 6/2007 | Morie et al. |
| 2007/0279120 A1 | 12/2007 | Brederlow et al. |
| 2008/0007980 A1 | 1/2008 | Fujiwara |
| 2008/0030237 A1 | 2/2008 | Danioni et al. |
| 2008/0076371 A1 | 3/2008 | Dribinsky et al. |
| 2008/0272845 A1 | 11/2008 | Willassen et al. |
| 2011/0156819 A1 | 6/2011 | Kim et al. |
| 2011/0163779 A1 | 7/2011 | Hidaka |
| 2012/0038344 A1 | 2/2012 | Kim et al. |
| 2014/0055194 A1 | 2/2014 | Burgener et al. |
| 2015/0002195 A1 | 1/2015 | Englekirk et al. |
| 2015/0002214 A1 | 1/2015 | Englekirk et al. |
| 2015/0084610 A1 | 3/2015 | Kim et al. |

FOREIGN PATENT DOCUMENTS

| | | |
|---|---|---|
| EP | A-0 938 094 | 8/1999 |
| EP | 2421132 | 2/2012 |
| EP | 1664966 | 7/2014 |
| JP | 55-75348 | 6/1980 |
| JP | 04-34980 | 2/1992 |
| JP | 04-334105 | 11/1992 |
| JP | 06-314985 | 11/1994 |
| JP | 06-334506 | 12/1994 |
| JP | 08-307305 | 11/1996 |
| JP | 09-200021 | 7/1997 |
| JP | 10-93471 | 4/1998 |
| JP | 10-242477 | 9/1998 |
| JP | 10-242829 | 9/1998 |
| JP | 10-344247 | 12/1998 |
| JP | 11-136111 | 5/1999 |
| JP | 2000166220 | 6/2000 |
| JP | 2001-051758 | 2/2001 |
| JP | 2001-119281 | 4/2001 |
| JP | 2004-147175 | 5/2004 |

(56) References Cited

FOREIGN PATENT DOCUMENTS

| JP | 2006-352326 | 12/2006 |
|---|---|---|
| JP | 5675529 | 1/2015 |
| WO | WO2010/008586 A2 | 1/2010 |

OTHER PUBLICATIONS

Englund, Terry Lee, Notice of Allowance received from the USPTO dated Jul. 5, 2012 for related U.S. Appl. No. 12/799,583, 8 pgs.
Peregrine Semiconductor Corporation, Response filed in the EPO dated May 15, 2012 for related appln. No. 10011669.8, 19 pgs.
Wang, Chi-Chang, et al., "Efficiency Improvement in Charge Pump Circuits", IEEE Journal of Solid-State Circuits, vol. 32, No. 6, Jun. 1997, pp. 852-860.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512.
Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.
Su, Pin, et al., "On the Body-Source Built-In Potential Lowering of SOI MOSFETs", IEEE Electron Device Letters, vol. 24, No. 2, Feb. 2003, pp. 90-92.
Yang, Min, "Sub-100nm Vertical MOSFET's with Si1-x-y GexCy Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Kim, et al., Amendment—Response to Restriction filed in the USPTO dated Apr. 15, 2013 for related U.S. Appl. No. 13/054,781, 5 pgs.
Young, Lee W., International Search Report and Written Opinion received from USRO dated Mar. 14, 2011 for related appln. No. PCT/US2009/004149, 25 pages.
Peregrine Semiconductor Corporation, photocopy of an Article 19 Amendment Under Section 205(b) and Rule 46.5(b) PCT and clean copy of claims for related appln. No. PCT/US2009/004149 dated May 13, 2011, 17 pages.
European Patent Office, photocopy of Communication Pursuant to Rules 161(2) and 162 EPC received from the EPO for related appln. No. 09798318.3 dated May 19, 2011, 2 pgs.
Sircus, Brian, Notification of Transmittal of International Preliminary Report on Patentability dated Aug. 10, 2011 for related application No. PCT/US2009/04149, 17 pgs.
European Patent Office, Invitation pursuant to Rule 63(1) EPC dated Aug. 19, 2011 for related appln. No. 11154275.9, 3 pgs.
Fedi, Giulio, Extended Search Report received from the EPO dated Mar. 5, 2012 for related appln. No. 11154277.5, 8 pgs.
Adams, W.J., et al., "OTA Extended Adjustment Range and Linearization Via Programmable Current Mirrors", Circuits and Systems, 1991, Proceedings of the 34th Midwest Symposium on Monterey, CA, USA 14-17, May 1991.
Bogdan, Pankiewicz, et al., "A Field Programmable Analog Array for CMOS Continuous-Time OTA-C Filter Applications", IEEE Journal of Solid-State Circuits, IEEE Service Center, Piscataway, NJ, USA, vol. 37, No. 2, Feb. 1, 2002.
Jader, et al., "A Linearly Tunable Low-Voltage CMOS Transconductor with Improved Common-Mode Stability and Its Application to gm-C Filters", IEEE Transactions on Circuits and Systems II: Analog and Digitalsignal Processing/ISSN 1057-7130, Institute of Electrical and Electronics Engineers Inc., vol. 48, No. 7, Jul. 1, 2001.
Peregrine Semiconductor Corporation, Response filed in the EPO dated Oct. 2, 2012 for related appln. No. 11154277.5, 14 pgs.
Nguyen, Hieu P., Office Action received from the USPTO dated Nov. 14, 2012 for related U.S. Appl. No. 13/054,781, 5 pgs.
Kim, et al., Amendment—Response to Restriction Requirement filed in the USPTO dated Apr. 15, 2013 for related U.S. Appl. No. 13/054,781, 5 pgs.

Nguyen, Hieu P., Office Action received from the USPTO dated Jun. 11, 2013 for related U.S. Appl. No. 13/054,781, 45 pgs.
Tokuda, Kenji, Office Action and English translation received from the JPO dated Jul. 13, 2013 for related appln. No. 2011-518737, 10 pgs.
Peregrine Semiconductor Corporation, Response filed in the EPO dated Oct. 11, 2011 for related appln. No. 11154275.9 4 pgs.
Kim, et al., Response filed in the USPTO dated Oct. 11, 2013 for related U.S. Appl. No. 13/054,781, 13 pgs.
Meulemans, Bart, Extended Search Report received from the EPO dated Oct. 22, 2013 for related appln. No. 11154275.9, 6 pgs.
European Patent Office, Communication pursuant to Rule 69 EPC received from the EPO dated Nov. 25, 2013 for related appln. No. 11154275.9, 2 pgs.
Meulemans, Bart, Extended Search Report received from the EPO dated Jan. 22, 2014 for related appln. No. 09798318.3 6 pgs.
Moon, et al., "Design of a Low-Distortion 22-kHz Fifth-Order Bessel Filter", IEEE Journal of Solid-State Circuits, vol. 28, No. 12, Dec. 1993, pp. 1254-1263.
European Patent Office, Communication pursuant to Rules 70(2) and 70a(2) EPC received from the EPO dated Feb. 14, 2014 for related appln. No. 09798318.3, 1 pg.
Nguyen, Hieu P., Notice of Allowance received from the USPTO dated Mar. 13, 2014 for related U.S. Appl. No. 13/054,781, 19 pgs.
Peregrine Semiconductor Corporation, Amendment filed in the EPO dated May 9, 2014 for related appln. No. 11154275.9, 4 pgs.
Chapman, Philip, "Declaration in Accordance with 37 CFR 1.56 and 1.68", dated Jun. 13, 2014 regarding U.S. Appl. No. 12/460,442, executed on Jun. 13, 2014, being filed herewith, 3 pgs.
Exhibit A, Sales Order Acknowledgment No. 100434 dated Jun. 22, 2007 from Peregrine Semiconductor Corporation to Motorola Inc., 1 pg.
Exhibit B, Sales Order Acknowledgment No. 100142 dated Mar. 30, 2007 from Peregrine Semiconductor Corporation to Motorola Inc., 1 pg.
Exhibit C, Peregrine Semiconductor Corporation's detailed Shipment Log of Peregrine's PE42510 and PE42650 parts from year 2006 through 2009, 21 pgs.
Exhibit D, "PE42510/42650 Production Tapeout Readiness Review", Mark Englekirk, Peregrine Semiconductor Corporation, Doc. No. 31/0189 Rev. 01, Oct. 30, 2007, 24 pgs.
Chapman, Philip, "Declaration in Accordance with 37 CFR 1.56 and 1.68", dated Jun. 13, 2014 regarding related U.S. Appl. No. 13/054,781, executed on Jun. 13, 2014, 3 pgs.
Imbernon, L., Decision to Grant a European patent pursuant to Article 97(1) EPC received from the EPO dated Jul. 3, 2014 for related appln. No. 04816848.8, 2 pgs.
Peregrine Semiconductor Corporation, Response filed in the EPO dated Aug. 19, 2014 for related appln. No. 09798318.3, 20 pgs.
European Patent Office, Examination as to Formal Requirements Invitation to Remedy Deficiencies received from the EPO dated Oct. 1, 2014 for appln. No. 14178741.6, 1 pg.
Wells, Kenneth B., Office Action received from the USPTO dated Oct. 20, 2014 for U.S. Appl. No. 14/230,945, 5 pgs.
Nguyen, Hieu P., Notice of Allowance received from the USPTO dated Nov. 13, 2014 for U.S. Appl. No. 13/054,781, 13 pgs.
Englekirk, Robert Mark, Response filed in the USPTO dated Nov. 13, 2014 for U.S. Appl. No. 13/933,006, 12 pgs.
Nguyen, Hiey P., Notice of Allowance received from the USPTO dated Jul. 8, 2014 for related U.S. Appl. No. 13/054,781, 61 pgs.
Englekirk, Robert Mark, Response filed in the USPTO dated Aug. 25, 2014 for related U.S. Appl. No. 13/932,996, 14 pgs.
Englund, Terry Lee, Final Office Action received from the USPTO dated Sep. 18, 2014 for related U.S. Appl. No. 13/796,780, 25 pgs.
Swonger, James, Response filed in the USPTO dated Dec. 18, 2014 for U.S. Appl. No. 14/230,945, 6 pgs.
Burgener, et al., Response After Final Office Action filed in the USPTO dated Dec. 18, 2014 for U.S. Appl. No. 13/769,780, 21 pgs.
Englund, Terry Lee, Advisory Action received from the USPTO dated Jan. 6, 2015 for U.S. Appl. No. 13/769,780, 12 pgs.
Englund, Terry Lee, Final Office Action received from the USPTO dated Jan. 20, 2015 for U.S. Appl. No. 13/932,996, 65 pgs.

(56) References Cited

OTHER PUBLICATIONS

Wells, Kenneth B., Office Action received from the USPTO dated Jan. 20, 2015 for U.S. Appl. No. 14/230,945, 13 pgs.
Hiltunen, Thomas J., Final Office Action received from the USPTO dated Jan. 23, 2015 for U.S. Appl. No. 13/933,006, 68 pgs.
Kim, et al., Comments on Examiner's Statement of Reasons for Allowance filed in the USPTO dated Feb. 13, 2015 for U.S. Appl. No. 13/054,781, 3 pgs.
Imbernon, Lisa, Extended Search Report received from the EPO dated Jan. 8, 2015 for appln. No. 14178741.6, 6 pgs.
Matsumoto, Yasunori, English translation of Final Office Action received from the JPO dated Feb. 10, 2015 for appln. No. 2012-243547, 2 pgs.
Englekirk, Robert Mark, Response to Final Pre-RCE Office Action filed in the USPTO dated Mar. 20, 2015 for U.S. Appl. No. 13/932,996, 14 pgs.
Englekirk, Robert Mark, Response After Final Office Action filed in the USPTO dated Mar. 23, 2015 for U.S. Appl. No. 13/933,006, 16 pgs.
Hiltunen, Thomas J., Final Office Action received from the USPTO dated Apr. 2, 2015 for U.S. Appl. No. 13/933,006, 20 pgs.

\* cited by examiner

LEVEL SHIFTER WITH OUTPUT SPIKE REDUCTION

This application claims priority under 35 USC 119 to U.S. provisional application No. 61/135,278 filed Jul. 18, 2008 and entitled "Circuits for a Charge Pump with Common Mode Tuning Op Amp", the entire contents of which are hereby incorporated herein by reference.

BACKGROUND

1. Field

The present disclosure is applicable to electronic integrated circuits ("ICs"), and particularly to level shifter circuits that convert binary signals from one voltage range to a different voltage range.

2. Related Art

It is usually desirable for an IC to operate from a single voltage supply. However, many ICs require two or more different voltage supplies internally for ideal operation. In such circumstances a binary-level signal that operates satisfactorily within the bounds of a first supply often needs to be conditioned so that it is capable of controlling circuits that operate across a different, typically wider, voltage range. Ideally, circuits are available that accept a logic level input signal to control one or more outputs that each range from the most positive voltage of a first, higher supply voltage to the lowest (or most negative) voltage of a second, lower supply voltage. In this paper, such circuits are referred to as "level shifters". The logic level signal range need not be identical to either the higher or the lower supply voltage.

FIG. 1 illustrates an example of a level shifter that responds to a logic level input to control a circuit operating over a wider voltage range than that of the logic supply. The circuit operating over a wider voltage range is a relatively simple RF switch. A differential output level shifter 800 accepts a "Select A/B" input signal 102 that operates between logic+ and logic−. Both level shifter outputs switch between the positive supply, VDD 104, and the negative supply, VSS 106, depending on the voltage of the input 102. If the input 102 is high then OUT 108 will be driven to approximately VDD, while OUTX 110 will be driven to approximately VSS.

The voltages of the logic supply, and of VDD 104 and VSS 106, depend on the requirements of the circuit in which the level shifter operates. VDD and VSS supplies are often symmetric, having the same magnitude voltage. The exemplary embodiment described in the most detail herein is suitable for symmetric positive and negative supplies, but is also suitable for asymmetric supplies. As one example, logic+ and VDD 106 may both have a value of approximately 2.4V with respect to circuit common, which in turn may be approximately equal in potential to an RF reference voltage "ground" 140. VSS 106 may be −3.4V with respect to ground 112.

In other circuits the supply values may vary widely. As a first representative alternative, VDD may be +10V, logic+ +3V, logic− 0V, and VSS −10V. As a second representative alternative, VDD may be +6V, VSS may be −5V, and logic+ may be 0V while logic− is −5V. In a third alternative, VDD may be 2.4V, logic+ may be 2.4V, logic− may be 0 or common, and VSS may be −2.4V. The input control voltage range need not extend to either VDD or VSS. Indeed, though it is typically so, 0V or the "common" voltage disposed between VDD and VSS need not constitute either logic+ or logic−.

In the exemplary circuit of FIG. 1 the outputs OUT 108 and OUTX 110 control an SPDT (single pole double throw) RF switch to connect an antenna 114 to either an RF input A 116, or to an RF transmit signal B 118. When Select A/B 102 is high (or, more generally, "true"), the level shifter output OUT 108 is driven to about VDD, turning on FETs $M_1$ 120 and $M_2$ 122. The level shifter inverted output OUTX 110 is concurrently driven to VSS, turning off FETs $M_3$ 124 and $M_4$ 126. Consequently, the antenna 114 is coupled via FET $M_2$ 122 to input A 116 of a low noise amplifier (LNA) 128, which provides an amplified signal to RF Rcv 130 which is coupled to further receive processing circuits (not shown).

An RF signal intended for transmission may be provided to RF input 132 of a power amplifier 134, the output of which is matched to the impedance of the antenna 114 by a matching network 136. The matching network typically includes a blocking capacitor or other mechanism such that the RF transmit signal B 118 has a large amplitude RF signal with a mean voltage of zero volts. The RF Xmt input 132 should be quiescent when Select A/B 102 is true. In this "A" selection condition, FET $M_3$ 124 is off, while FET $M_1$ 120 shunts any residual signal present at B 118 to ground 112, thus minimizing interference with the extremely small RF receive signal picked up by the antenna 114.

When Select A/B 102 is false, OUT 108 is driven to VSS and OUTX 110 is driven to VDD. This causes FETs $M_3$ 124 and $M_4$ 126 to be turned on, and FETs $M_1$ 120 and $M_2$ 122 to be turned off. Accordingly, the RF transmit signal A 118 is no longer shunted to ground by $M_1$ 120, but instead is coupled to the antenna 114. The sensitive input to the LNA 128 is protected by $M_2$ 122 having a high impedance, plus $M_4$ 126 shunting any leakage signal to ground 112. Gate resistors (not shown) in series with the gate of each of M1-M4, in conjunction with parasitic drain-gate and gate-source capacitances Cdg and Cgs, protect the FETs from suffering excess voltages from gate to drain or source (Vgs and Vgd) because of the high frequency of the zero-average RF signal at B 118.

FIG. 1 illustrates an exemplary use of a level shifter to provide drive control to an RF signal switch circuit. The voltages VDD and VSS may be adjusted to the requirements of the FET switches, which often operate at much higher voltages than those employed for select signal Select A/B 102. The FETs of the RF SPDT switch may be high voltage devices, or may be low voltage devices arranged in a "stacked" or multiple-gate configuration that increases the overall voltage withstand capability of the switch. Of course, though FIG. 1 illustrates only one type of use for level shifter circuits such as level shifter 800, level shifters are employed in myriads of different types of circuits. Level shifters are thus highly useful for a wide range of purposes.

A method and apparatus having improved features for level shifting are described herein. The maximum operating voltage of a level shifter depends in part on the characteristics of the semiconductor process by which it is fabricated. However, circuit switching details may cause voltages to appear across devices, such as FETs, that have a transient value that is greater than the static voltages of the circuit. Such excessive voltages, even though transient, may eventually cause the level shifter circuit to fail even if they are too small to cause apparent harm for some time.

Among other useful features, the method and apparatus described herein include features that avoid such excessive transient voltages across semiconductor devices of a level shifter. This enables a given semiconductor process to control higher voltage and power, resulting in more cost-effective and reliable level shifters. Various aspects of the method and apparatus described herein will be seen to provide further advantages, as well.

SUMMARY

An improved level shifting method and apparatus is described for generating a control output that has a significantly wider voltage range than the voltage range over which an input control signal operates. Many level shifter topologies are possible, some examples of which are set forth in U.S. Pat. No. 6,804,502 entitled "Switch Circuit and Method of Switching Radio Frequency Signals" issued Oct. 12, 2004 to Burgener, et al., the entire contents of which are hereby incorporated herein by reference.

One embodiment is a method of creating a final output signal from a level shifter circuit that substantially approaches a maximum voltage VDD in a first static state and a minimum voltage VSS in an opposite second static state, the state controlled by an input control signal to the level shifter within an input control voltage range that is substantially smaller than, and distinct from, the range from VDD to VSS. The method includes generating the final output signal from a final output drive block and generating, for each final output drive block of the level shifter, upper and lower source supply signals from corresponding upper and lower source supply drivers. Each upper source supply signal is "at a rail" approximating VDD in one static state and is "at common" approximating an intermediate value COM in the opposite static state, and each lower source supply signal is "at a rail" approximating VSS in one static state and "at common" approximating COM in the opposite static state, such that in each of the opposite static states one of the source supply signals for a particular final output driver is "at a rail" and the other of the source supply signals is "at common". In response to each change from one state to the opposite state initiated by a change in the input control signal, the method further includes preventing the source supply signal that is "at common" from beginning to transition away from that condition until after another drive signal has completed a significant portion of a transition from "at a rail" toward its "at common" value.

The method of the foregoing embodiment may include generating, under control of a single control signal to a level shifter circuit, both a first differential final output signal from a first final output drive block and a second differential final output from a second final output drive block, the first and second final output signals inverted with respect to each other such that in one static state the first final output approaches VDD and the second output approaches VSS, and in the opposite state the second output approaches VDD and the first output approaches VSS. The method includes providing a corresponding upper and lower source supply signal pair to each of the final output blocks such that in each static state one of each pair of source supply signals is "at common" and the other source supply signal of the pair is "at a rail". The method may further include, in response to a change from one state to the opposite state initiated by the single control signal, preventing the source supply of one pair that is "at common" from beginning to transition to "at a rail" until after a source supply signal of the other pair has transitioned substantially from "at a rail" toward "at common". In response to the same change of state, the method may alternatively prevent the source supply of each pair that is "at common" from beginning to transition to "at a rail" until after the other source supply signal of such pair has transitioned substantially from "at a rail" toward "at common".

In some embodiments the level shifter may have two stages including a front end level shifter stage that produces differential intermediate level shifted outputs inverted with respect to each other from intermediate output drivers under control of the same input control signal, plus high and low intermediate source supply signals for each of the intermediate output drivers. In that case, the method may further include coupling VSS to all intermediate output drivers and all intermediate source supply drivers of such a front end level shifter stage via a resistor larger than 1000 ohms. The method may also include disposing a capacitance between the high and low intermediate source supply signals for each intermediate output driver.

Another embodiment is a level shifter having at least one final output ranging from about a maximum voltage VDD of a positive supply with respect to a common voltage in a first static state to about a minimum voltage VSS of a negative supply with respect to common in a second static state, either state selectable by an input voltage value within an input voltage range much less than the range VSS to VDD. Each final output driver stage is supplied by a corresponding high-level source drive circuit having an output "at a rail" and approximating VDD in one state and "at common" approximating common in the opposite state, and by a corresponding low-level source drive circuit having an output "at common" approximating common in one state and "at a rail" approximating VSS in the opposite state, such that in each static state one of the source drive outputs is "at common" and the other source drive output is "at a rail", such final output drive circuit thereby providing a final output at approximately VDD in one state and VSS in the opposite state. The level shifter further includes "away from common" transition delay circuitry configured to delay a transition by a source drive output from "at common" toward a rail until a different source drive output has significantly transitioned from "at a rail" toward common.

The level shifter may be a differential-output level shifter including circuitry to produce final outputs inverted from each other, a non-inverted final output being approximately VSS in a first state and approximately VDD in an opposite second state, and an inverted final output being approximately VDD in the first state and approximately VSS in the opposite second state. In that case the "away from common" transition delay circuitry may preclude transmission of a changing control signal to a source drive circuit for the non-inverted final output driver having output "at common" until after a different source drive output for the inverted final output driver has significantly transitioned from "at a rail" toward common. Initiation of all transitions of source drive outputs from "at common" toward "at a rail" may be similarly precluded until a source drive output from a relatively inverted final output driver has significantly transitioned from "at a rail" toward common.

The "away from common" delay circuitry may alternatively delay initiation of transitions by a source drive output for a particular final output driver from "at common" until after a source drive output for the same particular final output driver has significantly begun to transition from "at a rail" toward common.

Any such level shifter may include two level shifting stages, each independently generating a final output ranging from VDD to VSS based only on one or more input signals each limited to a range substantially smaller than VDD to VSS. In particular, the input signal ranges may be limited to the range VDD to common and/or the range common to VSS, exclusive of signals ranging from VDD to VSS. Any such level shifter may additionally include a resistor within an order of magnitude of 10 k ohms in series between a supply source and all circuits of a level shifter stage coupled to such supply source. Any such level shifter may include circuitry that clamps each high-side and low-side control signals for a supply source driver at a level causing the supply source driver to output common, and to unclamp such control signals only after another supply source driver output significantly transitions toward common from "at a rail". In particular, any such level shifter may concurrently clamp such control signals and decouple the clamped control signal from a signal source by means of a clamped-output transmission gate.

Embodiments of the level shifting method or apparatus may employ any combination of individual features of any described embodiment, insofar as such combination of features is practical and is not expressly disavowed within this paper.

BRIEF DESCRIPTION OF THE DRAWINGS

Embodiments of the present invention will be more readily understood by reference to the following figures, in which like reference numbers and designations indicate like elements.

DETAILED DESCRIPTION

The level shifting method and apparatus described herein are particularly suited to avoiding a transient appearance of excessive differential voltage between drive signals coupled to an output drive block (or intermediate output drive block) of an integrated circuit level shifter.

Figure 1:
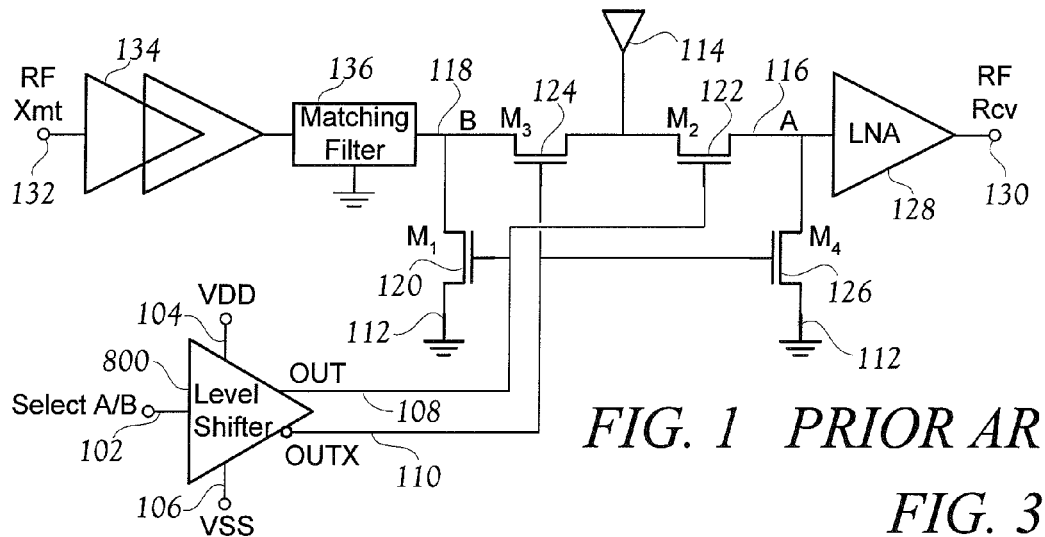
FIG. 1 is a simplified schematic diagram of a level shifter controlling an RF switching circuit.
Figure 2:
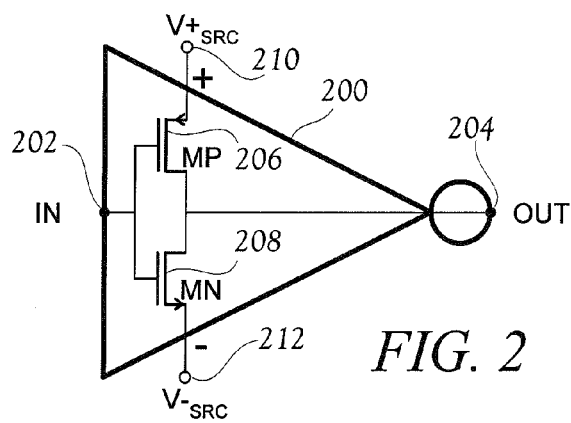
FIG. 2 illustrates the circuit that is represented by inverter symbols.

FIG. 2 illustrates the transistor configuration represented by inverter symbols 200 throughout this paper. The inverter symbols include an input IN 202 on the side opposite the "bubble", and an output OUT 204 at the end of the bubble. Input IN 202 is coupled to the gates of both a P channel FET MP 206 and an N channel FET MN 208. The drains of these two FETs are both coupled to OUT 204. The source of MP 206 is coupled to a positive supply connection "$V+_{SRC}$" 210, represented schematically by a plus sign "+", while the source of MN 208 is coupled to a negative supply connection "$V-_{SRC}$" 212, represented by a minus sign "−".

Ideally, the threshold voltages of the FETs are controlled to be greater than half of the expected maximum voltage difference between $V+_{SRC}$ 210 and $V-_{SRC}$ 212, such that when IN 202 is rising, MP 206 will turn off before MN 208 begins to turn on, and vice versa. However, in the exemplary process the threshold voltage are only about IV, while the expected voltage difference between $V+_{SRC}$ 210 and $V-_{SRC}$ 212 is typically 2.4 V. As such, there is a finite amount of time when both devices in an inverter 200 are "on", causing simultaneous conduction or "shoot-through" current. However, unlike clocked circuits, level shifters switch a control signal which changes relatively infrequently, so a modest amount of transitional electrical noise does not significantly add to average emissions. For frequent signal changes, or when input transitions are slow, the supplies $V+_{SRC}$ 210 and $V-_{SRC}$ 212 are limited, typically by means of current limit circuits.

The devices for each inverter 200 are selected for the desired output drive capacity. For balanced output drive, the MP 206 may need to have some combination of greater wider and/or shorter length compared to the MN 208, due to the typically lower conductance of a given size of P channel FET versus an equal sized N channel FET.

Unless otherwise noted, the inverters represented in subsequent figures by inverter symbols of type 200 may be assumed to have N and P FETs that are differently sized to be comparably conductive. The size of the inverter symbols 200 roughly indicates the size of the devices in the represented inverter. Small, medium and large inverter symbols 200 are employed. In an exemplary silicon-on-sapphire process employed by the inventor, all FETs in inverter blocks 200 may be assumed to have Vth of about 1 V (−1 V for P FETs). Small inverter blocks may be assumed to indicate an N FET 208 having a channel of 2 microns width and 0.8 micron length, and a P FET 206 having a channel of 3 micron width and 0.5 micron length. Medium size inverters represent an N FET having a channel 4 microns wide and 0.8 microns long, and a P FET with channel 6 microns wide, 0.5 microns long. The large inverter symbols 200 represent an N FET of channel width 20 microns and length 0.8 microns, and a P FET also of width also 20 microns but of length 0.5 microns. The skilled person will have no trouble selecting suitable FET sizes for varying processes and circuit requirements.

Figure 3:
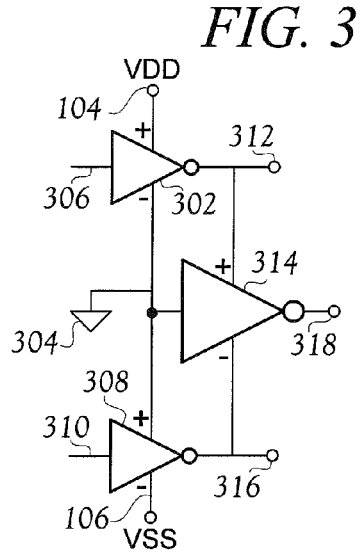
FIG. 3 is a simplified schematic diagram of a level shifter stage.

FIG. 3 is a simplified schematic of a basic single-stage level shifter. In overview, inputs to a high-side inverter 302 and a low-side inverter 308 control the source voltages for an output inverter 314. VDD 104 is coupled to the $V+_{SRC}$ connection of a first inverter block 302 whose $V-_{SRC}$ connection is coupled to a common voltage 304 which is often approximately midway between VDD 104 and VSS 106. The input 306 to inverter 302 operates typically switches between the levels of VDD 104 and common voltage 304, though devices may be fabricated to accept inputs over other ranges. A second inverter block 308 has the $V+_{SRC}$ input coupled to the common voltage 304 and the $V-_{SRC}$ coupled to VSS 106, so that its input 310 typically, though not necessarily, accepts a control input that switches between approximately VSS 106 and common 304.

The output 312 of inverter 302 switches between about common 304 and VDD 104, and is provided to the $V+_{SRC}$ connection of a third, larger inverter block 314 whose $V-_{SRC}$ connection is coupled to the output 316 of the inverter 308, which switches between about VSS 106 and common 304. Accordingly, when a suitable logic low level (about common 304) is applied to input 306, and a different suitable logic low level (about VSS 106) is applied to input 310, outputs 312 and 316 go to VDD and common, respectively. Thus, inverter 314 has only a single supply voltage (VDD—common) disposed across its source connections. When inputs 306 and 310 are switched to suitable logic low levels of about common and VSS, respectively, the outputs 312 and 316 go to common voltage and VSS, respectively. Thus, output inverter 314 again has only one supply voltage (common—VSS) disposed across its source connections.

Thus, the $V+_{SRC}$ connection 312 and $V-_{SRC}$ connection 316 of the output inverter 314 switches between VDD and common, respectively, for suitable logic low levels on inputs 306 and 310, and common a VSS, respectively, for suitable logic high levels on inputs 306 and 310. Because the input of the output inverter 314 is coupled to common 304, its output 318 goes to about VDD in the logic low input condition, and to about VSS in the logic high condition. Output 318 is the primary output of this level shifter stage.

In some exemplary embodiments of level shifters, the FETs in inverter block 314 have the same breakdown voltage as do those in inverters 302 and 308, and both are close to the greater of the first supply (VDD—common) or the second supply (common—VSS). Under such circumstances it is important that outputs 312 and 316 are never at VDD and VSS, respectively, and indeed it is important that the voltage difference across the outputs not exceed the greater of the two supply voltage magnitudes at any time either the P FET or the N FET of output inverter block 314 is conducting. Such overvoltage conditions may be avoided by the principles illustrated in the circuits of FIGS. 4-9.

Figure 4:
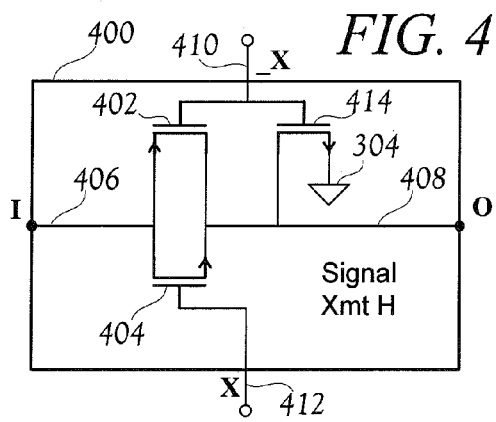
FIG. 4 illustrates a transmission gate plus clamp circuit block for high-side signals.
Figure 5:
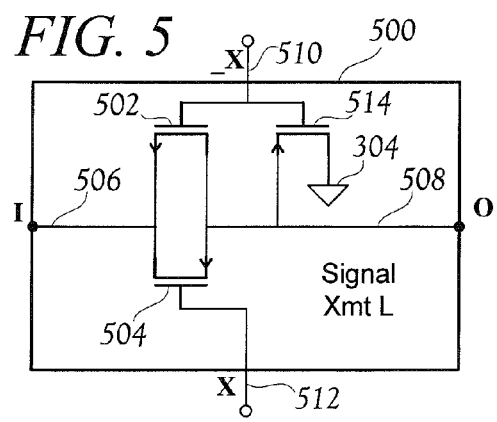
FIG. 5 illustrates a transmission gate plus clamp circuit block for low-side signals.

FIGS. 4 and 5 are signal transmit blocks that include a transmission gate and a clamp to common. Signal Transmit H 400 of FIG. 4 is intended for operation with a "high" side signal between VDD and common. The transmission gate consisting of P FET 402 and N FET 404 couples a signal between input I 406 and output O 408 when the control signals _X 410 and X 412 are logic low (common) and high (VDD) respectively. The signal is within a suitable voltage range, which in the exemplary embodiment is the same as the range of the control inputs 410 and 412, i.e., between common and VDD. When the control signals _410 and X 412 are inverted to logic high (VDD) and low (common) respectively, the signal at I 406 is blocked, and the output O 408 is clamped down to common by N FET 414.

Signal Transmit L 500 of FIG. 5 is intended for "low" side operation between common and VSS. The transmission gate consisting of N FET 502 and P FET 504 couples a signal between input I 506 and output O 508 when the control signals _X 510 and X 512 are logic low (VSS) and high (common) respectively. The signal is within a suitable voltage range, which in the exemplary embodiment is the same as the range of the control inputs 510 and 512, i.e., between VSS and common. When the control signals _X 510 and X 512 are inverted to logic high (common) and low (VSS) respectively, the signal at I 506 is blocked, and the output O 508 is clamped up to common by P FET 514.

Figure 6:
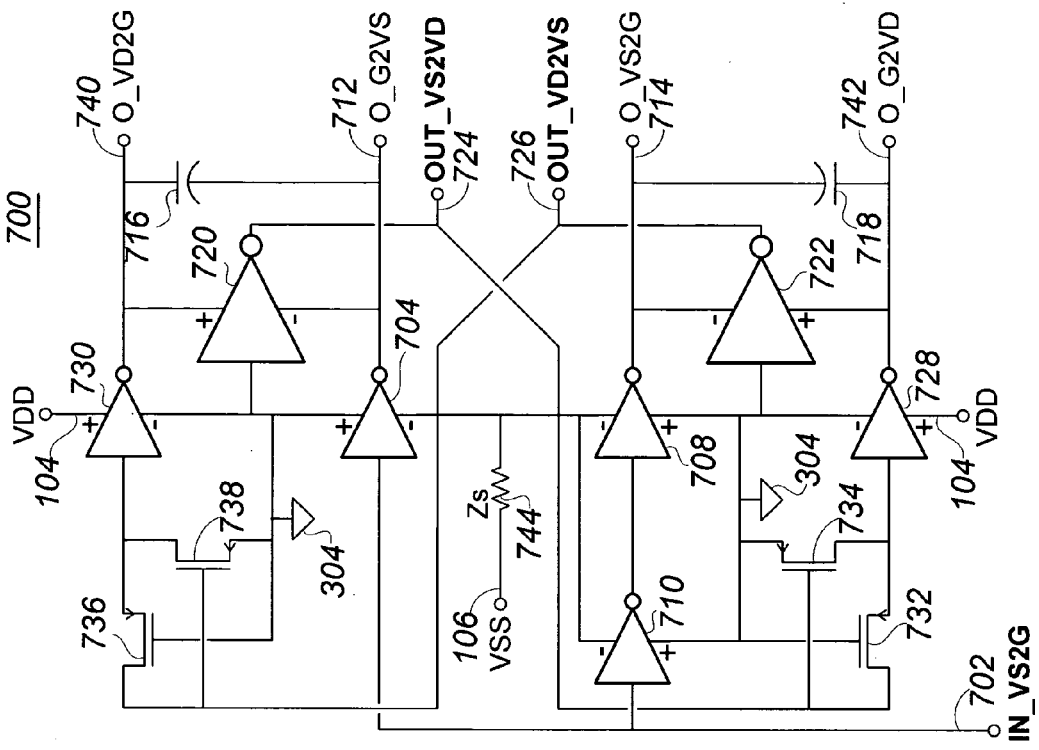
FIG. 6 schematically illustrates a single-stage level shifter circuit controlled by a high-side control signal between ground and VDD.
Figure 7:
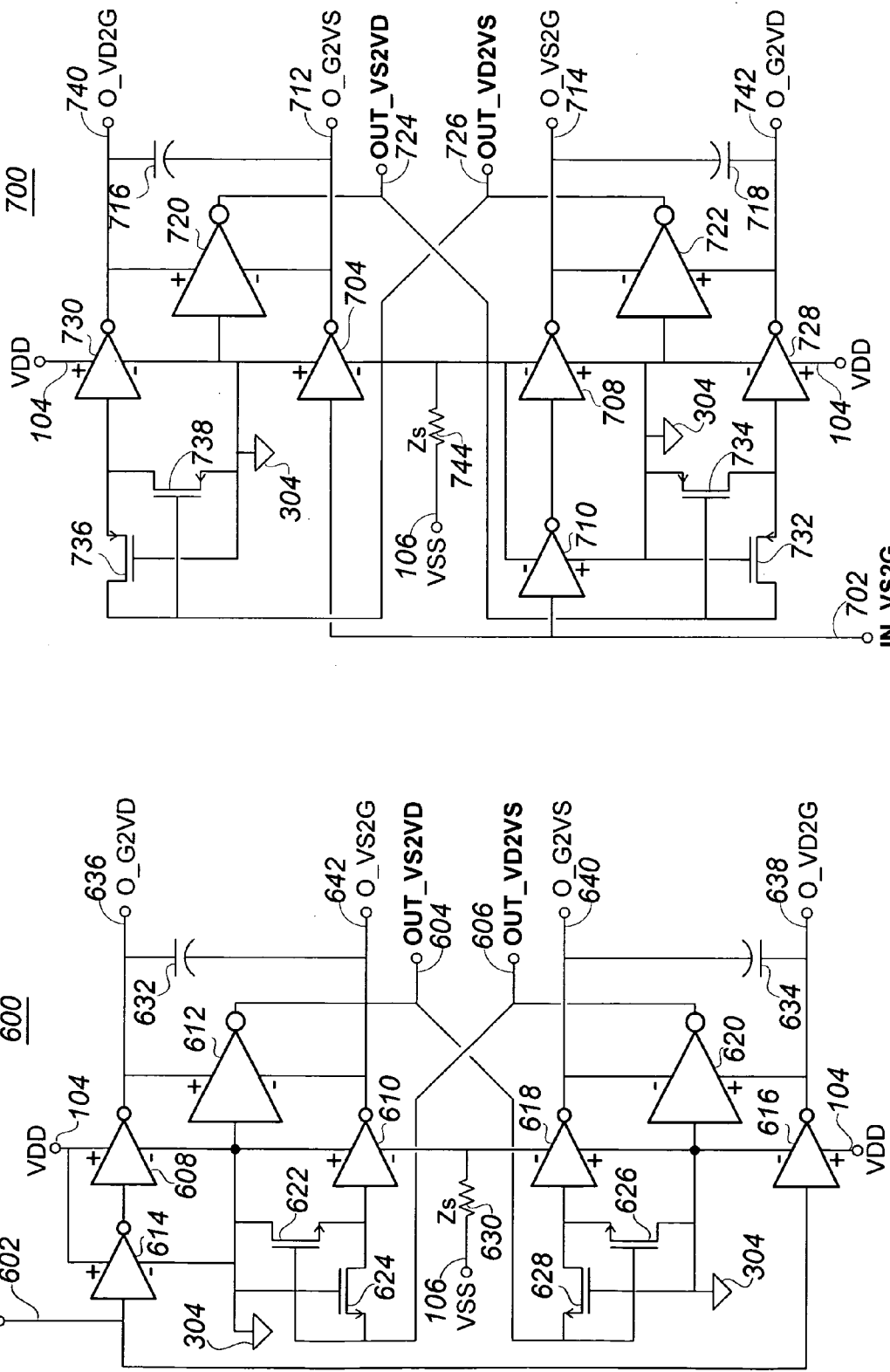
FIG. 7 schematically illustrates a single-stage level shifter circuit controlled by a low-side control signal between VSS and ground.

FIGS. 6 and 7 are both schematic diagrams of single stage differential output level shifters. The level shifter 600 of FIG. 6 operates with a "high side" logic control input at IN_G2VD 602, i.e., between common (low) and VDD (high). The level shifter 700 of FIG. 7 operates with a "low side" logic control input at IN_VS2G 702, i.e., between VSS (low) and common (high).

The level shifter 600 includes a non-inverting output OUT_VS2VD 604 that rises from VSS to VDD when the input IN_G2VD rises from common to VDD, and an inverted output OUT_VD2VS 606 that falls from VDD to VSS in response to the same input change. The two outputs are generated by two inverter trios configured similarly as the high-side inverter 302, low-side inverter 308 and output inverter 314 of FIG. 3. High-side inverter 608, low-side inverter 610 and output inverter 612 generate the non-inverting output OUT_VS2VD 604. This output is rendered non-inverting from the input by the additional high-side inverter 614 that inverts IN_G2VD for the input to inverter 608. High-side inverter 616, low-side inverter 618 and output inverter 620 generate inverting output OUT_VD2VS, which, as in FIG. 3, is inverting with respect to the input.

The input to low-side inverter 610 is provided by the inverting output OUT_VD2VS 606. However, that output signal ranges from VSS to VDD, so it is limited to the proper input range (VSS to common) by N FETs 622 and 624. When the output OUT_VD2VS 606 is VDD, N FET 622 couples the input of 610 to common 304, and when the output is VSS, N FET 624 couples the input of 610 to VSS. Similarly, the input to low-side inverter 618 is provided by the non-inverting output OUT_VS2VD 604, which is limited to the low-side input range by N FETs 626 and 628.

In addition to the extra inverting stage 614 and the signal limiting FETs 622-624 and 626-628, each half of level shifter 600 differs from the circuit of FIG. 3 by virtue of an impedance Zs 630 in the connection to source supply VSS 106. Zs 630 serves to limit the value of the low-side supply during transitions from one state to another. Because there is little DC current flow, it has no impact on steady-state voltages. In conjunction with capacitors 632 and 634 (typically about 0.5 pF each), Zs 630 limits the transient voltage swings that would otherwise occur across the source supplies of the output inverters 612 and 620, respectively. The high-side inverters 608 and 616 are directly controlled by IN_G2VD 602; hence outputs O_G2VD 636 and O_VD2G 638 will begin to change first. Capacitor 634 causes the sink of inverter 620 to track its source, O_VD2G 638, causing output OUT_VD2VS 606 to rise. In turn, that causes inverter 610 to drive toward VSS, which reinforces the movement toward VSS by O_VS2G that was previously caused by capacitor 632 as driven by inverter 608. In the same manner, capacitor 632 enables inverter 612 to almost immediately switch toward VSS in response to a falling input at IN_G2VD 602. That in turn causes inverter 618 to reinforce the rise toward ground of O_G2VS 640 that was previously caused by capacitor 634 driven by inverter 616.

Zs 630 may serve a plurality of purposes. It may facilitate an ability of capacitors 632 and 634 to maintain the source voltage across output inverters 612 and 620 reasonably constant during the switching sequence. It also slows switching speed. In exemplary embodiments Zs is simply a resistor of 5 k to 20 k ohms, but may have a resistance within an order of magnitude of 10,000 ohms. Moreover, Zs may have an inductive component, or even be primarily inductive, in which case the impedance magnitude should be determined at a transition frequency Ft that is 1/Ts, where Ts is the transition time from an input transition at, e.g., IN_G2VD 602, to O_VS2G 642. Ts may alternatively be calculated as the time between other suitable voltage transitions. The magnitude of the impedance Zs should be greater than 1000 ohms at Ft, or may be limited to being within an order of magnitude, or alternatively within a factor of 4, of 10,000 ohms at Ft. Generally, it is preferable for it to be substantially larger than Rds(on) of the inverters to which it is coupled (inverters 610, 618 in FIG. 6, and 704, 708 in FIG. 7). Zs may, in fact, be an active FET device, with or without a second cascode device, configured to operate substantially as a limited current source during transitions. Zs 630 is particularly useful when the VDD and VSS supplies (with respect to common) are asymmetric, i.e., have different magnitudes, in which case Zs should be disposed in series with the supply that is of larger magnitude. VDD and VSS are asymmetric in an exemplary embodiment: VSS is about −3.4 V, while VDD is about +2.4 V, both with respect to common. Accordingly, in such embodiment Zs 630 is disposed in series with VSS.

The single stage differential output level shifter 700 of FIG. 7 operates quite similarly as level shifter 600. However, input IN_VS2G 702 directly drives low-side inverters 704 and 708, the latter via extra low-side inverter 710. Thus, low side output O_G2VS 712 will switch first, closely followed (due to extra inverter 710) by low side output O_VS2G 714.

Capacitors 716 and 718 (e.g., about 0.5 pF) will hold the source voltage substantially constant across the output inverters 720 and 722, respectively. This in turn permits the output inverters to switch the outputs OUT_VS2VD 724 and OUT_VD2VS 726. Those output voltages create the input voltages to high-side inverters 728 and 730, respectively, after limitation to high-side input range by P FET pairs 732, 734 and 736, 738, respectively. The switching of the high-side inverters 730 and 732 finally reinforces the voltage of outputs O_VD2G 740 and O_G2VD 742, which were initially driven only via the capacitors 716 and 718. As in the level shifter 600, Zs 744 (5 k to 20 k ohms, primarily resistive, in exemplary embodiments) may be disposed in series with a supply, particularly when VDD and VSS are asymmetric with respect to common. Zs 744 may serve, for example, to facilitate the ability of the capacitors 716 and 718 to maintain constant source voltage for the output inverters during switching, particularly when the VDD and VSS supplies are asymmetric. Zs 744 may take on any value as described above for Zs 630, and may be replaced by a current limiting circuit.

Figure 8:
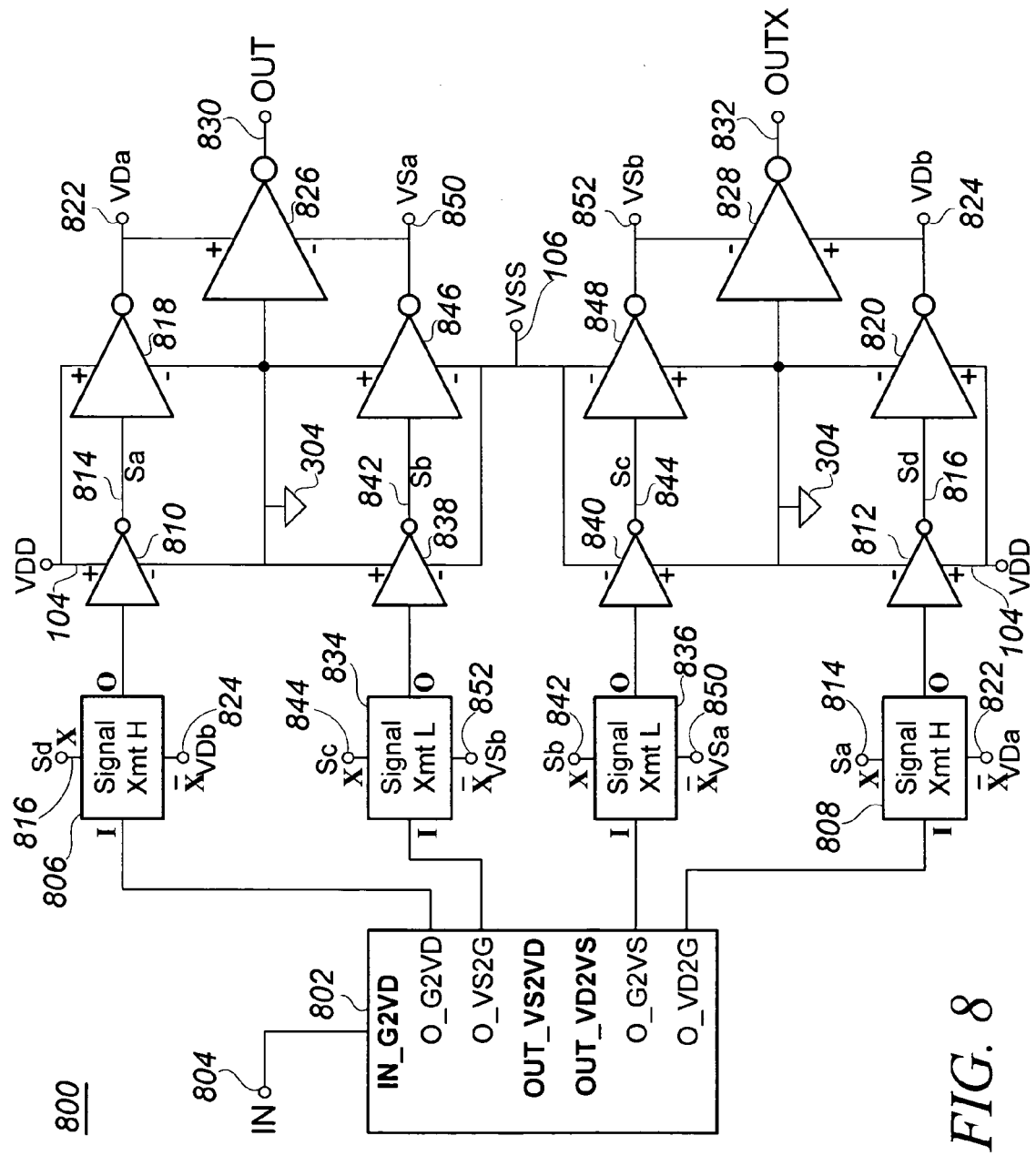
FIG. 8 schematically represents a two-stage differential output level shifter with output block drive supply differential limiting.

FIG. 8 schematically illustrates a two-stage differential output level shifter 800. The first stage 802 is a single stage differential output level shifter having outputs as indicated in the level shifters 600 and 700 of FIGS. 6 and 7. However, because input 804 is presumed to accept high-side control levels, level shifter 802 employs the switching logic of the level shifter 600. The level-shifted outputs of the first stage 802 (OUT_VS2VD and OUT_VD2VS) are used only internally. Only the high-side and low-side outputs, including the inverted outputs O_VD2G and O_G2VS, respectively, and the non-inverted outputs O_G2VD and O_VS2G, respectively, are used. These signals are coupled to a second stage of level shifter 800 via signal transmit blocks. The high-side outputs are coupled via Signal Transmit H blocks 806 and 808, then via high-side inverters 810 and 812, to produce high side signals Sa 814 and Sd 816. These signals are again inverted by higher power inverters 818 and 820 to produce VDa 822 and VDb 824, which are V+$_{SRC}$ connections for the highest power output inverters 826 and 828, respectively. The outputs of those inverters 826 and 828 are the final level shifted differential outputs OUT 830 and OUTX 832 of the two stage level shifter 800. Similarly, the low-side outputs are coupled to the second stage via Signal Transmit L blocks 834 and 836, and then via low-side inverters 838 and 840 to establish signals Sb 842 and Sc 844. Larger low-side inverters 846 and 848 produce the low-side non-inverted and inverted outputs VSa 850 and VSb 852, respectively. VSa 850 and VSb 852 are the V−$_{SRC}$ connections for the output inverters 826 and 828, respectively.

Either the V+$_{SRC}$ or the V−$_{SRC}$ connection of an output inverter is at common 304 in every static state. If such connection at common voltage moves toward its particular supply rail (VDD for V+$_{SRC}$, VSS for V−$_{SRC}$) faster than the opposite source connection moves toward common, then the net voltage across the output inverter will increase above its static value. This can impair reliability if the FETs are operating near their voltage withstand capacity. To avoid such transient voltage spikes it is desired to ensure that whichever source supply (V+$_{SRC}$ or V−$_{SRC}$) will be moving toward common voltage will be forced to substantially begin its transition before the opposite source is permitted to begin transitioning. This is accomplished in the level shifter 800 by means of the Signal Transmit blocks 806, 808 and 834, 836.

When IN 804 is logic high, VDa 822 is at VDD, VSa 850 at common, VDb 824 at common and VSb 852 is at VSS. When IN 804 transitions to logic low, all of these voltages will change, but the transitions of VSa 850 and VDb 824 are delayed. They will change in response to the signal from Signal Transmit L block 834 and Signal Transmit H block 808, respectively. However, signals VSb 852 (VSS) on X and Sc 844 (common) on _X initially disable Signal Transmit L block 834, while signals VDa 822 (VDD) on X and Sa 814 (common) initially disable Signal Transmit H block 808. VSb 852 and Sc 844 are permitted to change by Signal Transmit L block 836, which is initially enabled by VSa 846 (common) on X and Sb 842 (VDD) on _X.

When IN 804 is logic low, VDa 822 is at common, VSa 850 at VSS, VDb 824 at VDD and VSb 852 is at common. When IN 804 transitions to logic low, the transitions of VDa 822 and VSb 852 are delayed by the initial condition of Signal Transmit blocks 806 and 836. These Signal Transmit blocks will not be enabled to transmit the new signal from the first stage 802 until VDb 824 and Sd 816, as well as VSa 846 and Sb 842, have substantially transitioned. In all cases, suitable transition threshold voltages should be selected to ensure that racing cannot permit voltage spikes across the source voltages of the output inverters 826 and 828.

In level shifter 800, initially disabled Signal Transmit blocks for one side of the level shifter (either the non-inverted OUT side, or the opposing OUTX side) are enabled by the transition of an output an on the opposite side. These signals are not available in single-ended (one sided) level shifters, so an alternative circuit is illustrated for such level shifters in FIG. 9.

Figure 9:
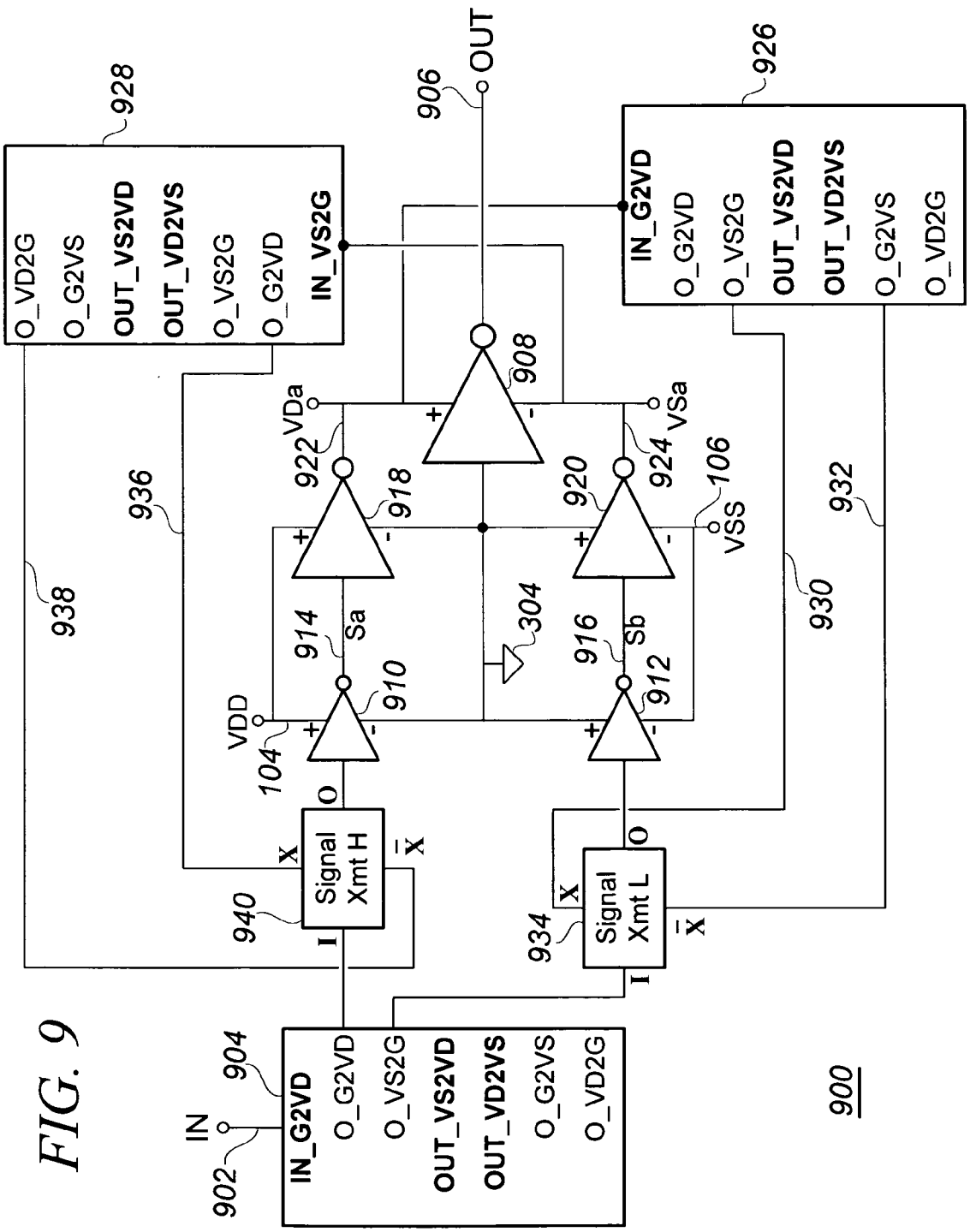
FIG. 9 schematically represents a two-stage single-ended output level shifter with output block drive supply differential limiting.

A logic input 902 arbitrarily selected to accept inputs between VDD and common controls the two stage single-ended level shifter 900 of FIG. 9. The first stage (or front end) is a differential level shifter 904, which may be implemented identically as the level shifter 600 of FIG. 6, or in any other manner that will provide a high-side non-inverted output O_G2VD between common and VDD, and a low-side non-inverted output O_VS2G between VSS and common. Of course, additional inverters in both sides affect only the polarity of the net output OUT 906 from the large output inverter 908. The small inverters 910 and 912 produce inverted signals Sa 914 and Sb 916, which are inverted by medium inverters 918 and 920 to produce higher power non-inverted signals VDa 922 and VSa 924, which in turn are V+$_{SRC}$ and V−$_{SRC}$ for the output inverter 908.

Due to the lack of the opposite or differential "side" in a single-ended level shifter, one solution is to employ two additional single-stage level shifters 926 and 928. The level shifter 926 accepts a high-side input control from VDa 922 and thus may be implemented like level shifter 500 of FIG. 5, while the level shifter 928 accepts a low-side input control from VSa 924 and thus may be implemented like level shifter 600 of FIG. 6. The low-side outputs of level shifter 926, non-inverting output O_VS2G 930 and inverting output O_G2VS 932 are coupled respectively to X and _X of low-side Signal Transmit L block 934. The high-side outputs of level shifter 928, non-inverting O_G2VD 936 and inverting O_VD2G 938 are coupled respectively to X and _X of Signal Transmit H block 940. Thereby, when VDa 922 is at common, it is prevented from switching toward VDD until after a rising VSa enables Signal Transmit H block 940 via level shifter 928; and conversely, when VSa 924 is at common, it is prevented from switching toward VSS until after a falling VDa 922 enables Signal Transmit L block 934 via level shifter 926. With proper attention to threshold voltages, level shifter 900 may be even more resistant to excess voltage spikes across its output inverter 908 than is level shifter 800, but significant additional circuitry is used to ensure suitable timing.

Level shifter input voltage ranges are typically between VDD and common, or between common and VSS, but the level shifters can readily be modified to accept control input over a nearly arbitrary input voltage range. Input circuitry of level shifter 600 of FIG. 6 accepts control input voltages on the high side (VDD to common), while input circuitry of level shifter 700 of FIG. 7 accepts control input voltages on the low side (common to VSS). In view of such alternative input ranges, in combination with input range limiting circuitry (e.g., such as represented by FETs 622 and 624 of FIG. 6) and standard engineering knowledge, a skilled person will readily be able to implement embodiments of any level shifter described herein to accept inputs within another input voltage range. Such input voltage range can be made nearly arbitrary by use of range limiting circuitry, plus amplifying circuitry if needed. Thus, although a level shifter by definition controls an output over a different output voltage range than the input voltage range, no particular restriction on the relationship between input and output voltage ranges is necessary.

Although exemplary embodiments are shown, there are many ways to achieve substantially the same result. In particular, the Signal Transmit blocks in FIGS. 8 and 9 may be replaced by any suitable logic function that achieves substantially the same effect. Different level shifter circuits may be used in place of level shifter stages 802, 902, 926 and 928, and the inverter blocks may be implemented differently.

Conclusion

The foregoing description illustrates exemplary implementations, and novel features, of a level shifter with output spike reduction, and of a method of shifting voltage while avoiding output drive spikes. The skilled person will understand that various omissions, substitutions, and changes in the form and details of each of the methods and apparatus illustrated may be made without departing from the scope of such apparatus or method. Because it is impractical to list all embodiments explicitly, it should be understood that each practical combination of features set forth above (or conveyed by the figures) that is suitable for embodying one of the apparatus or methods constitutes a distinct alternative embodiment of such apparatus or method. Moreover, each practical combination of equivalents of such apparatus or method alternatives also constitutes an alternative embodiment of the subject apparatus or method. Therefore, the scope of the presented methods and apparatus should be determined only by reference to the claims that are appended, as they may be amended during pendency of any application for patent. The scope is not limited by features illustrated in the exemplary embodiments set forth herein for the purpose of illustrating inventive concepts, except insofar as such limitation is incorporated in a particular appended claim.

The circuits illustrated and described herein are only exemplary, and should be interpreted as equally describing such alternatives as may be reasonably seen to be analogous by a person of skill in the art, whether by present knowledge common to such skilled persons, or in the future in view of unforeseen but readily-applied alternatives then known to such skilled persons.

All variations coming within the meaning and range of equivalency of the various claim elements are embraced within the scope of the corresponding claim. Each claim set forth below is intended to encompass any system, apparatus or method that differs only insubstantially from the literal language of such claim, but only if such system, apparatus or method is not an embodiment of the prior art. To this end, each element described in each claim should be construed as broadly as possible, and should be understood to encompass any equivalent to such element insofar as possible, except that any construction encompassing the prior art is an unintended and overbroad construction.

What is claimed is:

1. A level shifter apparatus having at least one level-shifted final output ranging from about a positive supply rail voltage VDD in a first state to about a negative supply rail voltage VSS in a second state, either of the two states adapted to be selected based on value of an input control signal operating within a range substantially different from the range between the negative supply rail voltage VSS and the positive supply rail voltage VDD, the level shifter comprising:

a) a first inverting circuit and a second inverting circuit configured to output a first inverter output voltage and a second inverter output voltage, respectively, to a first final output circuit, the first final output circuit configured to produce a level-shifted final output based on the first inverter output voltage and the second inverter output voltage, wherein:

i) the first inverter output voltage is within a range from about a common voltage to about the positive supply rail voltage VDD, ii) the second inverter output voltage is within a range from about the common voltage to about the negative supply rail voltage VSS, and iii) in either of the first and second states of the level-shifted final output, one of the inverter output voltages is either at about the negative supply rail voltage VSS or at about the positive supply rail voltage VDD and the other inverter output voltage is at about the common voltage; and b) a first transition control circuitry and a second transition control circuitry connected with the first inverting circuit and the second inverting circuit, respectively, each of the transition control circuitries configured to delay a transition of a corresponding inverter output voltage from around the common voltage toward either about the negative supply rail voltage VSS or about the positive supply rail voltage VDD until the other inverter output voltage has significantly transitioned from either about the negative supply rail voltage VSS or about the positive supply rail voltage VDD toward the common voltage.

2. The level shifter of claim 1, further comprising a second final output circuit for producing a level-shifted final output inverted with respect to the level-shifted final output of the first final output circuit, wherein:

a) the second final output circuit is coupled to a third inverter output voltage via a third inverting circuit and to a fourth inverter output voltage via a fourth inverting circuit, b) the third inverter output voltage is within a range from about the common voltage to about the positive supply rail voltage VDD, and c) the fourth inverter output voltage is within a range from about the common voltage to about the negative supply rail voltage VSS.

3. The level shifter of claim 2, further comprising a third transition control circuitry and a fourth transition control circuitry connected with the third inverting circuit and the fourth inverting circuit, respectively, each of the transition control circuitries configured to delay, after a state change initiated by a change in the value of the input control signal, initiation of transitions of a corresponding inverter output voltage from about the common voltage toward either about the positive supply rail voltage VDD or about the negative supply rail voltage VSS until the other inverter output voltage has significantly transitioned from either about the positive supply rail voltage VDD or about the negative supply rail voltage VSS toward the common voltage.

4. The level shifter of claim 3, wherein the first and second inverter output voltages are coupled to the first final output circuit and the third and fourth inverter output voltages are coupled to the second final output circuit, and wherein the inverter output voltages associated with the transition from either about the negative supply rail voltage VSS or about the positive supply rail voltage VDD toward the common voltage are coupled to one of the first and second final output circuits while the inverter output voltages associated with the delayed transition are coupled to the other final output circuit.

5. The level shifter of claim 3, wherein the first and second inverter output voltages are coupled to the first final output circuit and the third and fourth inverter output voltages are coupled to the second final output circuit, and wherein one inverter output voltage associated with the transition from either about the negative supply rail voltage VSS or about the positive supply rail voltage VDD toward the common voltage is coupled to one of the first and second final output circuits while another inverter output voltage associated with the delayed transition is coupled to the same final output circuit.

6. The level shifter of claim 1, wherein the first and second inverter output voltages are coupled to the first final output circuit and the third and fourth inverter output voltages are coupled to the second final output circuit, and wherein one inverter output voltage associated with the transition from either about the negative supply rail voltage VSS or about the positive supply rail voltage VDD toward the common voltage is coupled to one of the first and second final output circuit while another inverter output voltage associated with the delayed transition is coupled to the same final output circuit.

7. The level shifter of claim 1, wherein a change in the value of the input control signal results in i) a state change in the level-shifted output voltage and ii) initiation of transitions in each of the first and second inverter output voltages.

8. A circuital arrangement having a final output voltage ranging from about a positive supply rail voltage VDD in a first state to about a negative supply rail voltage VSS in a second state, either of the two states adapted to be selected based on value of an input control signal operating within a range substantially different from the range between the negative supply rail voltage VSS and the positive supply rail voltage VDD, the circuital arrangement comprising:
   a) a first stage comprising a first level shifter and a second level shifter, each level shifter comprising the level shifter apparatus of claim 1, wherein each level shifter comprises two inverting circuits configured to provide a first intermediate voltage that is within a range from about a common voltage to about the positive supply rail voltage VDD and a second intermediate voltage that is within a range from about the common voltage to about the negative supply rail voltage VSS;
   b) a second stage configured to produce the final output voltage based on the first and second intermediate voltages from each of the first and second level shifters; and
   c) a non-parasitic capacitance disposed between each inverting circuit in the two inverting circuits in each level shifter.

9. The circuital arrangement of claim 8, wherein each of the first and second transition control circuitries comprises a transmission gate and a clamping circuit both controlled by outputs of the second stage to interrupt and clamp one of the first and second intermediate voltages from each of the first and second level shifters to the common voltage and transmit the other intermediate voltage from each of the first and second level shifters.

10. A circuital arrangement having a final output voltage ranging from about a positive supply rail voltage VDD in a first state to about a negative supply rail voltage VSS in a second state, either of the two states adapted to be selected based on value of an input control signal operating within a range substantially different from the range between the negative supply rail voltage VSS and the positive supply rail voltage VDD, the circuital arrangement comprising:
   a) a first stage comprising a first level shifter and a second level shifter, each level shifter comprising the level shifter apparatus of claim 1, wherein each level shifter comprises two inverting circuits configured to provide a first intermediate voltage that is within a range from about a common voltage to about the positive supply rail voltage VDD and a second intermediate voltage that is within a range from about the common voltage to about the negative supply rail voltage VSS;
   b) a second stage configured to produce the final output voltage based on the first and second intermediate voltages from each of the first and second level shifters; and
   c) a supply impedance Zs disposed such that coupling of any of the first and second intermediate voltages to a selected supply that is either the positive supply rail voltage VDD or the negative supply rail voltage VSS is coupled to such selected supply via series connection with Zs.

11. The level shifter of claim 10, further comprising a non-parasitic capacitance disposed between each inverting circuit in the two inverting circuits in each level shifter.

12. A method of developing, in a level shifter circuit, at least one output signal that substantially approaches an upper supply rail voltage VDD in a first state and substantially approaches a lower supply rail voltage VSS in a second state, either of the two states adapted to be selected based on value of an input control signal to the level shifter that falls suitably within an input control signal range that is substantially smaller than the range from the upper supply rail voltage VDD to the lower supply rail voltage VSS, the method comprising the steps of:
   a) applying the input control signal to a first inverting block to generate a first inverter output voltage and applying the input control signal to a second inverting block to generate a second inverter output voltage, wherein:
      i) the first inverter output voltage is within a range from about a common voltage to about the upper supply rail voltage VDD,
      ii) the second inverter output voltage is within a range from about the common voltage to about the lower supply rail voltage VSS, and
      iii) in either of the first and second states of the at least one output signal, one of the inverter output voltages is either at about the lower supply rail voltage VSS or at about the upper supply rail voltage VDD and the other inverter output voltage is at about the common voltage;
   b) applying the first and second inverter output voltages to a first output block to generate a first output signal among the at least one output signal; and
   c) during each transition of the at least one output signal between the first and second states initiated by a change in the input control signal, delaying initiation of a transition by the inverter output voltage that is at about the common voltage until after the other inverter output voltage that is either at about the upper supply rail voltage VDD or about the lower supply rail voltage VSS has significantly transitioned toward the common voltage.

13. The method of claim 12, further comprising:
applying the input control signal to a third inverting block to generate a third inverter output voltage and applying the input control signal to a fourth inverting block to generate a fourth inverter output voltage, wherein:
i) the third inverter output voltage is within a range from about the common voltage to about the upper supply rail voltage VDD,
ii) the fourth inverter output voltage is within a range from about the common voltage to about the lower supply rail voltage VSS, and
iii) in either of the first and second states of the at least one output signal, one of the third and the fourth inverter output voltage is either at about the lower supply rail voltage VSS or at about the upper supply rail voltage VDD and the other inverter output voltage is at about the common voltage;

applying the third and fourth inverter output voltages to a second output block to generate a second output signal among the at least one output signal, wherein the second output signal is inverted with respect to the first output signal, wherein:
i) the third inverter output voltage is inverted with respect to the first inverter output voltage, and
ii) the fourth inverter output voltage is inverted with respect to the second inverter output voltage.

14. The method of claim 13, further comprising preventing, for each of the first, second, third, and fourth inverter output voltages that is at about the common voltage, initiation of a transition toward either about the lower supply rail voltage VSS or about the upper supply rail voltage VDD until after the inverter output voltages have completed a significant portion of a transition from either about the lower supply rail voltage VSS or about the upper supply rail voltage VDD toward the common voltage.

15. The method of claim 13, further comprising preventing initiation of transitions of the inverter output voltages from the common voltage toward either about the lower supply rail voltage VSS or about the upper supply rail voltage VDD until after the other output voltages have transitioned substantially from either about the lower supply rail voltage VSS or about the upper supply rail voltage VDD toward the common voltage, wherein the inverter output voltages associated with the transitions from the common voltage toward either about the lower supply rail voltage VSS or about the upper supply rail voltage VDD and the inverter output voltages associated with the transitions from either about the lower supply rail voltage VSS or about the upper supply rail voltage VDD toward the common voltage are coupled to different output blocks.

16. The method of claim 13, further comprising preventing initiation of transitions of the inverter output voltages away from the common voltage toward either about the lower supply rail voltage VSS or about the upper supply rail voltage VDD until after the other inverter output voltages have transitioned substantially from either about the lower supply rail voltage VSS or about the upper supply rail voltage VDD toward the common voltage, wherein the inverter output voltages associated with the transitions from the common voltage toward either about the lower supply rail voltage VSS or about the upper supply rail voltage VDD and the inverter output voltages associated with the transitions from either about the lower supply rail voltage VSS or about the upper supply rail voltage VDD toward the common voltage are coupled to the same output block.

17. The method of claim 12, wherein the level shifter circuit comprises a first stage and a second stage, wherein the first stage produces two pairs of intermediate source supply signals, one of the two pairs consisting of a first intermediate voltage at about the common voltage in the first state and at about the upper supply rail voltage VDD in the second state and a second intermediate voltage at about the lower supply rail voltage VSS in the first state and at about the common voltage in the second state, the other of the two pairs consisting of a first intermediate voltage at about the upper supply rail voltage VDD in the first state and at about the common voltage in the second state and a second intermediate voltage at about the common voltage in the first state and at about the lower supply rail voltage VSS in the second state.

18. The method of claim 17, further comprising disposing a non-parasitic capacitor coupled to the first and second intermediate voltages of each pair of such supply signals.

19. The method of claim 17, further comprising coupling a selected supply, either the upper supply rail voltage VDD or the lower supply rail voltage VSS, to any intermediate voltage of the first stage only via a series impedance Zs common to all such couplings to the selected supply.

20. The method of claim 19, further comprising disposing a non-parasitic capacitor coupled to the first and second intermediate voltages of each pair of such supply signals.

21. The method of claim 17, further comprising delaying initiation of a transition by the inverter output voltage that is at the common voltage by interrupting one of the first and second intermediate voltages from the first stage at about the common voltage and clamping such intermediate voltage to about the common voltage until the one of the first and second intermediate voltages from the first stage is unclamped by the other intermediate voltages significantly transitioning from either about the lower supply rail voltage VSS or about the upper supply rail voltage VDD toward the common voltage.

* * * * *